(12) United States Patent
Veres et al.

(10) Patent No.: US 11,479,850 B2
(45) Date of Patent: Oct. 25, 2022

(54) SYSTEMS AND METHODS FOR IMPLEMENTING DIGITAL VAPOR PHASE PATTERNING USING VARIABLE DATA DIGITAL LITHOGRAPHIC PRINTING TECHNIQUES

(71) Applicant: Palo Alto Research Center Incorporated, Palo Alto, CA (US)

(72) Inventors: Janos Veres, San Jose, CA (US); Timothy D. Stowe, Alameda, CA (US); Gregory Whiting, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 205 days.

(21) Appl. No.: 16/834,527

(22) Filed: Mar. 30, 2020

(65) Prior Publication Data

US 2020/0283889 A1  Sep. 10, 2020

Related U.S. Application Data (62) Division of application No. 14/320,601, filed on Jun. 30, 2014, now abandoned.

(51) Int. Cl.
 *C23C 14/56* (2006.01)
 *C23C 14/04* (2006.01)
 (Continued)

(52) U.S. Cl.
 CPC .......... *C23C 14/562* (2013.01); *C23C 14/042* (2013.01); *C23C 14/54* (2013.01); *C23C 14/56* (2013.01); *C23C 14/5873* (2013.01)

(58) Field of Classification Search
 None
 See application file for complete search history.

(56) References Cited

U.S. PATENT DOCUMENTS 3,632,406 A * 1/1972 Clough ................... C23C 14/24
                                                       427/255.5
6,018,454 A   1/2000 Hatada et al.
                  (Continued)

OTHER PUBLICATIONS

Tsujioka et al., "Selective Metal Deposition on Photoswitchable Molecular Surfaces," J. Am. Chem Soc, 130 (32), pp. 10740-10747 (Jul. 16, 2008).

*Primary Examiner* — Karla A Moore
(74) *Attorney, Agent, or Firm* — Caesar Rivise, PC (57) ABSTRACT

A system and method are provided for implementing a unique scheme by which to execute digital vapor phase patterning on metals, semiconductor substrates and other surfaces using a proposed variable data digital lithographic image forming architecture or technique. For certain substrate printing and manufacturing applications, including some printed electronics applications, the disclosed schemes implement techniques to digitally pattern metal layers with bulk material properties in a manner that is aligned with underlying layers on the fly. The disclosed digital printing process may pattern a release oil on a substrate in support of a metal deposition process. Changeable patterning is implemented with an ability to modify the alignment of the patterns on-the-fly. The release layer on a drum is laser patterned in order that the patterned release layer is transferred to the substrate, or the patterning of the release layer is accomplished directly on the substrate.

20 Claims, 4 Drawing Sheets

(51) Int. Cl.
*C23C 14/54* (2006.01)
*C23C 14/58* (2006.01)

(56) References Cited

U.S. PATENT DOCUMENTS

| | | |
|---|---|---|
| 6,798,642 B2 | 9/2004 | Decker et al. |
| 6,882,452 B2 * | 4/2005 | Decker ................ G03H 1/0236 283/72 |
| 2005/0178281 A1 * | 8/2005 | Berg ...................... B41N 3/006 101/463.1 |
| 2007/0221610 A1 * | 9/2007 | Chow ................... H01L 21/302 216/13 |
| 2012/0103212 A1 * | 5/2012 | Stowe ...................... B41N 3/08 101/147 |

* cited by examiner

SYSTEMS AND METHODS FOR IMPLEMENTING DIGITAL VAPOR PHASE PATTERNING USING VARIABLE DATA DIGITAL LITHOGRAPHIC PRINTING TECHNIQUES

CROSS REFERENCE TO RELATED APPLICATIONS

This application is a divisional of U.S. patent application Ser. No. 14/320,601, filed Jun. 30, 2014, entitled "Systems and Methods for Implementing Digital Vapor Phase Patterning Using Variable Data Digital Lithographic Printing Techniques".

BACKGROUND

1. Field of Disclosed Subject Matter

This disclosure relates to systems and methods that provide unique techniques by which to implement digital vapor phase patterning on metals, semiconductor substrates and other surfaces using a proposed variable data digital lithographic image forming architecture.

2. Related Art

For a decade or so, it has been well known in certain fields, including in the manufacture of semiconductor devices, to deposit and patterned thin layers to a number of beneficial results, including the patterning of certain semiconductor devices. Variations in the deposition and patterning steps define the function of the manufactured device and a density of individually patterned elements on the substrate.

A common patterning method for the deposited layers involves an optical patterning, and using related processes. In a photolithographic process, for example, a substrate coated with a photosensitive resist layer deposited thereon is irradiated with short-wavelength light projected through a mask layer generally formed of opaque and transparent regions. A shadow of the opaque regions in the photomask forms a pattern of dark and illuminated regions in the resist layer. Chemical and physical changes occur in the exposed areas of the resist layer. A resultant latent image is then developed, for example, by rinsing the substrate with an appropriate solvent. Selected regions of the resist remain, which after a post-exposure baking step form a stable pattern on the substrate. This pattern can be used as a stencil in the next process step. For example, areas of the underlying substrate that are not protected by the resist pattern may be etched or doped. Material may be selectively deposited on the substrate. After processing, the remaining resist may be stripped. Many photolithography and processing cycles may be performed to create complex devices.

The multi-step process then breaks down as follows. First, a resist layer is deposited on a surface of a substrate, such as a silicon wafer, to form a very thin, uniform layer. Next, a baking step takes place to bake the layer at a temperature sufficient to evaporate residual solvent in the resist layer. Then, a latent image is formed in the resist layer via one of a number of techniques including exposure to ultraviolet light through the photomask with opaque and transparent regions, or by direct writing using a laser beam or electron beam. In a next step, areas of the resist layer that have (or have not) been exposed are removed by rinsing with an appropriate solvent to "develop" the patterned resist layer. A second baking step may then be undertaken to fix the resist layer. Next, processing through the resist pattern is undertaken using any one of a number of processes. Finally, the resist layer is stripped leaving the finished product on the substrate.

As shown in the above example of a conventional patterning process, such as a patterning technique for semiconductor substrates, metals or other layered products, require a complex and complicated number of steps to accomplish the patterning of the layer of material.

Certain methods have been tried that are intended to reduce these costs and the need to most specifically control the environment. These methods include ink jetting the resist mask rather than, for example, conducting the complex vapor deposition processes. As mentioned above, another method includes a "maskless" etching process by which a laser is used to write the pattern rather than etching through a patterned deposition mask. These methods reduce the number of processing steps thereby reducing the cost.

Other techniques have been provided where the material could be patterned from the start without the requirement for the multiple layer processing to achieve a single finished layer. Such a technique may do away with a need to provide a resist layer by initially laying down the material in a patterned fashion. While inkjet provides an avenue by which to accomplish this in certain restricted scenarios, the inkjet process suffers from an inability to accurately and positively jet, for example, metals onto a substrate surface. In order to prevent jet clogging in an inkjet process, essentially all of the solid matter/materials in the solution to be jetted must be removed.

VAST FILMS® employs a process that it refers to as "Selective Metallization for Functional and Decorative Applications." This process is described as allowing "selective metallization on plastic films, providing the opportunity to create simple or complex patterns," often used for food labeling. In the VAST Process, a release oil is deposited on the substrate to hold the pattern like photoresist would. The release oil is stamped on the substrate with a preconfigured stamping apparatus having a patterned face. The metal layer is then deposited on the release oil patterned surface. The metal layer does not nucleate on the portions of the substrate where the release oil is deposited. Because the metal does not have a high stiction coefficient where the release oil is present, the release oil substantially repels the metal. Once the metal is deposited, heating of the substrate causes evaporation of the release oil leaving the metal pattern in the previously non-oiled portions of the substrate. This process reduces a requirement for the conventional hard bake and certain of the other conventional steps including resist layer etching and cleaning.

A problem with the VAST Process, however, is that on-the-fly alignment of multiple layers, where multiple layer deposition is preferred or required, is difficult. In situations where a roll-to-roll printed electronics process is undertaken, with patterned layers underneath, for example, one would be required to dynamically change tensions in a substrate to change positions to ensure the required level of accurate alignment is sustained. The components tend to drift over time making, for example, flexible electronics circuit alignments in a roll-to-roll process difficult.

SUMMARY OF THE DISCLOSED EMBODIMENTS

U.S. Patent Application Publication No. 2012/0103212 A1 (the 212 Publication) published May 3, 2012 and based on U.S. patent application Ser. No. 13/095,714, which is commonly assigned and the disclosure of which is incorporated by reference herein in its entirety, proposes systems and methods for providing variable data lithographic and offset lithographic printing or image receiving medium marking. The systems and methods disclosed in the 212 Publication are directed to improvements on various aspects of previously-attempted variable data digital imaging lithographic marking concepts based on variable patterning of dampening solutions to achieve effective truly variable digital data lithographic image forming.

Figure 1:
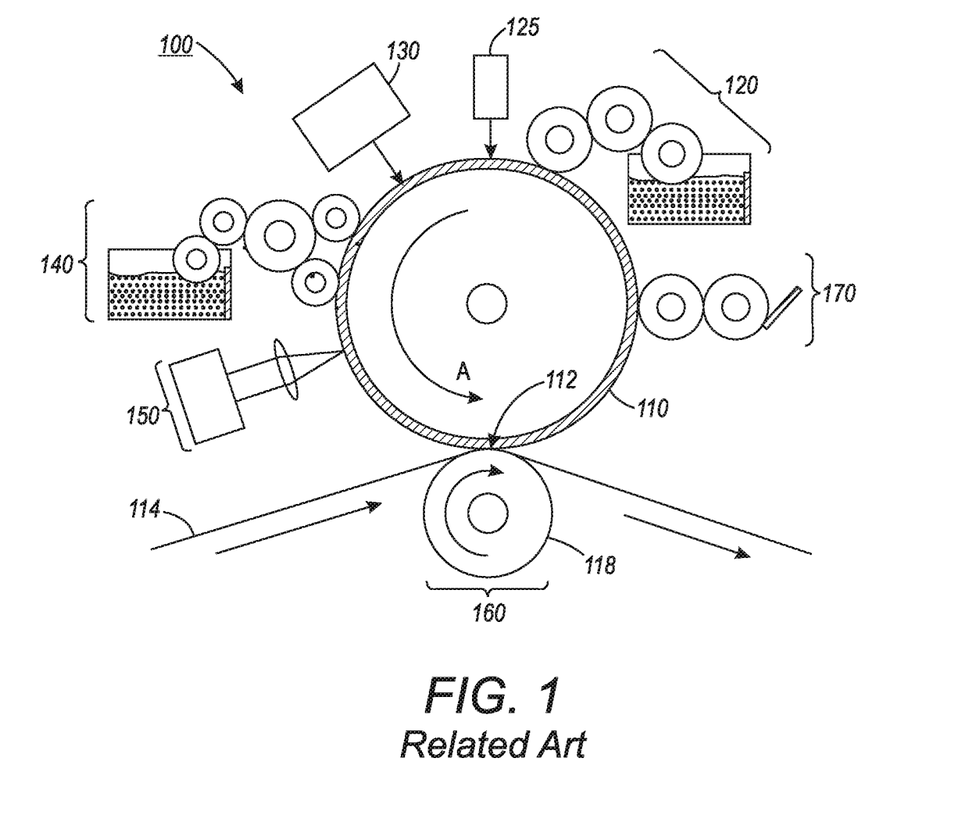
FIG. 1 illustrates a schematic representation of a proposed variable data digital lithographic image forming system.

The 212 Publication describes, in requisite detail, an exemplary variable data lithography system 100 such as that shown, for example, in FIG. 1. A general description of the exemplary system 100 shown in FIG. 1 is provided here. Additional details regarding individual components and/or subsystems shown in the exemplary system 100 of FIG. 1 may be found in the 212 Publication.

As shown in FIG. 1, the exemplary system 100 may include an imaging member 110. The imaging member 110 in the embodiment shown in FIG. 1 is a drum, but this exemplary depiction should not be read in a manner that precludes the imaging member 110 being a plate or a belt, or of another known configuration. The imaging member 110 is used to apply an inked image to an image receiving media substrate 114 at a transfer nip 112. The transfer nip 112 is produced by an impression roller 118, as part of an image transfer mechanism 160, exerting pressure in the direction of the imaging member 110. Image receiving medium substrate 114 should not be considered to be limited to any particular composition such as, for example, paper, plastic, or composite sheet film. The exemplary system 100 may be used for producing images on a wide variety of image receiving media substrates. The 212 Publication also explains the wide latitude of marking (printing) materials that may be used, including marking materials with pigment densities greater than 10% by weight. As does the 212 Publication, this disclosure will use the term ink to refer to a broad range of printing or marking materials to include those which are commonly understood to be inks, pigments, and other materials which may be applied by the exemplary system 100 to produce an output image on the image receiving media substrate 114.

The 212 Publication depicts and describes details of the imaging member 110 including the imaging member 110 being comprised of a reimageable surface layer formed over a structural mounting layer that may be, for example, a cylindrical core, or one or more structural layers over a cylindrical core. The reimageable surface may be formed of a relatively thin layer over the mounting layer, a thickness of the relatively thin layer being selected to balance printing or marking performance, durability and manufacturability.

The exemplary system 100 includes a dampening solution subsystem 120 generally comprising a series of rollers for uniformly wetting the reimageable surface of the imaging member 110 with a uniform layer of a dampening solution, with a thickness of the layer being controlled. The dampening solution may comprise water optionally with small amounts of isopropyl alcohol or ethanol added to reduce surface tension as well as to lower evaporation energy necessary to support subsequent laser patterning, as will be described in greater detail below. Experimental investigation has also shown low surface energy solvents such as volatile silicone oils can serve as dampening solutions, as well.

Once the dampening solution is metered onto the reimageable surface of the imaging member 110, a thickness of the layer may be measured using a sensor 125 that may provide feedback to control the metering of the dampening solution onto the reimageable surface by the dampening solution subsystem 120.

Once a precise and uniform amount of dampening solution is provided by the dampening solution subsystem 120 on the reimageable surface, and optical patterning subsystem 130 may be used to selectively form a latent image in the uniform dampening solution layer by image-wise patterning the dampening solution layer using, for example, laser energy. The reimageable surface of the imaging member 110 should ideally absorb most of the laser energy emitted from the optical patterning subsystem 130 close to the surface to minimize energy wasted in heating the dampening solution and to minimize lateral spreading of heat in order to maintain a high spatial resolution capability. Alternatively, an appropriate radiation sensitive component may be added to the dampening solution to aid in the absorption of the incident radiant laser energy. While the optical patterning subsystem 130 is described above as being a laser emitter, it should be understood that a variety of different systems may be used to deliver the optical energy to pattern the dampening solution.

The mechanics at work in the patterning process undertaken by the optical patterning subsystem 130 of the exemplary system 100 are described in detail with reference to FIG. 5 in the 212 Publication. Briefly, the application of optical patterning energy from the optical patterning subsystem 130 results in selective evaporation of portions of the layer of dampening solution.

Following patterning of the dampening solution layer by the optical patterning subsystem 130, the patterned layer over the reimageable surface is presented to an inker subsystem 140. The inker subsystem 140 is used to apply a uniform layer of ink over the layer of dampening solution and the reimageable surface layer of the imaging member 110. The inker subsystem 140 may use an anilox roller to meter an offset lithographic ink onto one or more ink forming rollers that are in contact with the reimageable surface layer of the imaging member 110. The inker subsystem 140 may deposit the ink to the pockets representing the imaged portions of the reimageable surface, while ink deposited on the unformatted portions of the dampening solution will not adhere based on a hydrophobic and/or oleophobic nature of those portions.

A cohesiveness and viscosity of the ink residing in the reimageable layer may be modified by a number of mechanisms. One such mechanism may involve the use of a rheology (complex viscoelastic modulus) control subsystem 150. The rheology control system 150 may form a partial crosslinking core of the ink on the reimageable surface to, for example, increase ink cohesive strength relative to the reimageable surface layer. Curing mechanisms may include optical or photo curing, heat curing, drying, or various forms of chemical curing. Cooling may be used to modify rheology as well via multiple physical cooling mechanisms, as well as via chemical cooling.

The ink is then transferred from the reimageable surface of the imaging member 110 to a substrate of image receiving medium 114 using a transfer subsystem 160. The transfer occurs as the substrate 114 is passed through a transfer nip 112 between the imaging member 110 and an impression roller 118 such that the ink within the voids of the reimageable surface of the imaging member 110 is brought into physical contact with the substrate 114. With the adhesion of the ink having been modified by the rheology control system 150, modified adhesion of the ink causes the ink to adhere to the substrate 114 and to separate from the reimageable surface of the imaging member 110. Careful control of the temperature and pressure conditions at the transfer nip 112 may allow transfer efficiencies to exceed 95%. While it is possible that some dampening solution may also wet substrate 114, the volume of such a dampening solution will be minimal, and will rapidly evaporate, or be absorbed by the substrate 114.

Following the transfer of the majority of the ink to the substrate 114 at the transfer nip 112, any residual ink and/or residual dampening solution must be removed from the reimageable surface of the imaging member 110 to prepare the reimageable surface to repeat the digital image forming operation. This removal is most preferably undertaken without scraping or wearing the reimageable surface of the imaging member 110. An air knife or other like non-contact device may be employed to remove residual dampening solution. It is anticipated, however, that some amount of ink residue may remain. Removal of such remaining ink residue may be accomplished through use of some form of cleaning subsystem 170. The 212 Publication describes details of such a cleaning subsystem 170 including at least a first cleaning member such as a sticky or tacky member in physical contact with the reimageable surface of the imaging member 110, the sticky or tacky member removing residual ink and any remaining small amounts of surfactant compounds from the dampening solution of the reimageable surface of the imaging member 110. The sticky or tacky member may then be brought into contact with a smooth roller to which residual ink may be transferred from the sticky or tacky member, the ink being subsequently stripped from the smooth roller by, for example, a doctor blade or other like device and collected as waste.

The 212 Publication details other mechanisms by which cleaning of the reimageable surface of the imaging member 110 may be facilitated. Regardless of the cleaning mechanism, however, cleaning of the residual ink and dampening solution from the reimageable surface of the imaging member 110 is essential to preventing ghosting in subsequent image forming operations as the images change. Once cleaned, the reimageable surface of the imaging member 110 is again presented to the dampening solution subsystem 120 by which a fresh layer of dampening solution is supplied to the reimageable surface of the imaging member 110, and the process is repeated.

According to the above proposed structure, variable data digital lithography has attracted attention in producing truly variable digital images in a lithographic image forming system. The above-described architecture combines the functions of the imaging plate and potentially a transfer blanket into a single imaging member 110.

As noted above, this VAST Process, and other like processes, apply a thin layer of patterned silicone, or other low surface energy, oil using a static letterpress printing technique. All of the prior art techniques require a predefined pattern, typically a static letterpress printing cylinder to deposit the oil pattern. Once applied, a patterned layer acts as a rejection layer for further metal deposition (evaporation/sputtering). The oil film must have a low enough vapor pressure and high enough boiling point that it can maintain its structure at the vacuum pressure used for deposition. The VAST and other like processes are inherently higher speed and more cost effective, but are currently limited to ~250 dpi (100 um minimum features) due to the dot gain of the letter press print process used. These patterning methods are currently implemented only as static patterning processes using letter press printing so they have certain resolution limitations, as well as alignment limitations, i.e., they are not capable of aligning one pattern to a pre-patterned substrate with high precision. The usefulness of these techniques could be greatly improved for multi-layer printed electronics if these limitations could be eliminated. Inkjet approaches may substantially solve the alignment problem, but they are limited in the materials that can be used in an inkjet printing nozzle, e.g., inkjet printing of metals is not ideal.

For certain substrate printing and manufacturing applications, including some printed electronics applications, it would be advantageous to implement techniques to digitally pattern metal layers with bulk material properties in a manner that could be aligned with underlying layers on the fly.

It would be advantageous to provide a digital printing process by which to pattern the release oil on a substrate in support of a unique metal deposition process. Changeable patterning could be implemented with an inherent ability to modify the alignment of the patterns on-the-fly.

Exemplary embodiments of the systems and methods according to this disclosure may laser pattern a release layer on a drum in order that the patterned release layer may be transferred to the substrate. Instead of having a static stamp to deposit the oil, the oil may be patterned on a reimageable surface of an imaging member (roller) using a laser system of evaporate and pattern the oil layer. This approach deviates from a stamp approach in that a stamp must, for example, be etched or engraved, requiring a certain level of upfront cost, and is then unchangeable.

Exemplary embodiments may provide a dynamic process by which to modify the oil layer release pattern on each pass providing an additional degree of freedom in the patterning process.

Exemplary embodiments may employ laser evaporation of the oil layer to provide an ability to do short-run patterning on-the-fly making it easier to implement, for example, different circuit geometries in a particular manufacturing run, thereby providing added flexibility.

Exemplary embodiments may provide an opportunity to increase the alignments fidelity of the images transferred to a substrate with a feedback system to determine a position of the substrate and a relative position of the transfer oil image reducing alignment errors to, for example, 10µ or less. Based on feedback received through the system, the laser pattern may be slightly modified in order to reduce alignment errors that may be caused by in-processing alignment drift.

Exemplary embodiments may employ a strobe light source in conjunction with one or more vision cameras, which may be placed at an edge of the substrate (including a web substrate), and which may be used in conjunction with particular sets of alignment or feedback marks, to determine precisely where a previously-deposited underlying pattern may be positioned. Based on the information provided by the visual sources, the variable data digital lithographic laser subsystem may be adjusted to account for any detected drift in an effort to achieve a substantially perfect alignment between a newly deposited oil layer and previously deposited underlying patterns on the substrate. The objective is to then pass the substrate through and to have the metal deposited on the substrate perfectly aligned with the previously deposited underlying pattern layers on the substrate.

Exemplary embodiments may provide that once the oil layer pattern on the substrate, the substrate is passed for depositing the metal layer on the substrate and then the substrate is passed across a downstream heating element to evaporate the deposited oil from the substrate leaving only the deposited metal layer(s).

Exemplary embodiments may accomplish a metal patterning process that does away with the steps requiring resist removal, post-process cleaning of the resist, and the like.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed systems and methods that provide a unique method by which to implement digital vapor phase patterning on metals and other surfaces using a proposed variable data digital lithographic image forming architecture, will be described, in detail, with reference to the following drawings, in which.

DETAILED DESCRIPTION OF THE DISCLOSED EMBODIMENTS

The systems and methods by which to implement a unique digital vapor phase patterning on metals, semiconductor substrates and other surfaces using a proposed variable data digital lithographic image forming architecture according to this disclosure will generally refer to this specific utility or function for those systems and methods. Exemplary embodiments described and depicted in this disclosure should not be interpreted as being specifically limited to any particular configuration of the described substrate printing (patterning) elements, or as being specifically directed to any particular intended use for those elements. Any advantageous adaptation of a digital image forming process to accommodate a maskless oil layer deposition and patterning process using a variable data digital lithographic image forming device of technique that facilitates high quality, and in-process alignable, layers for metal and other material deposition are contemplated as being included in this disclosure.

Specific reference to, for example, lithographic printing techniques, and to the proposed variable data digital lithographic image forming device should not be considered as being limited to any particular configuration of the techniques or devices, as described. The terms "image forming device," "lithographic image forming device/system," "offset lithographic marking device/system" and the like, as referenced throughout this disclosure are intended to refer globally to a class of devices and systems that carry out what are generally understood as variable data lithographic marking functions as those functions would be familiar to those of skill in the art. Additionally, while references will be made to individual oil-based control/release agent layers, these references are intended to be exemplary only and not limiting to the disclosed subject matter. Finally, the disclosed subject matter is intended to cover a broad class of systems and implementations for digital patterning of materials in vapor/chamber based deposition processes. Each of the exemplary implementations relates to material deposition on a receiving surface that is controlled with a surface agent that influences the rate of growth. In the disclosed embodiments, the surface agent is digitally patterned via selective desorption from a receiving surface, through selectively exposing the surface agent to light, heat or other radiation. The exposure can be laser light or selective "pixelated" heating with a thermal imaging source/head.

The disclosed embodiments address a need for advanced variable digital techniques that enable selective deposition of metals and other vacuum-deposited materials on a variety of substrates. Employing the proposed variable data digital lithographic image forming techniques, it was determined that the need can be addressed by laser patterning of a control/release agent such as an oil (1) on a reimageable surface of a particular imaging member for transfer to a substrate, or (2) directly on the substrate. The control/release agent may be uniformly coated on the reimageable surface or directly on the substrate, as appropriate and then selectively evaporated from the reimageable surface or the substrate through targeted laser or heat exposure. The remaining control/release agent transferred to, or present on, the substrate will inhibit the nucleation of vapor deposition atoms or molecules. This may occur, for example, by the control/release agent slowly evaporating during vacuum deposition. The control/release agent may also stop nucleation by virtue of having a low surface energy.

Suitable control/release agent materials may include oils such as paraffin, isopar, D4, D6, and silicone oils. As a control/release agent material, low surface energy fluorinated compounds such as Fluorinert solvents may also be used.

The imaging or patterning of the control/release agent may be performed by the use of the proposed variable data digital lithographic image forming architecture. This architecture typically employs a volatile silicone oil as a dampening solution to reject ink in a manner that is similar to how the static stamping processes employs a silicone oil (higher molecular weight) as the control/release agent to reject vapor deposited films. A proposed variable data digital lithographic image forming subsystem that patterns the dampening solution may be adapted to replace the letter press printing/stamping process to allow for high speed digital patterning of the control/release agent.

Figure 2:
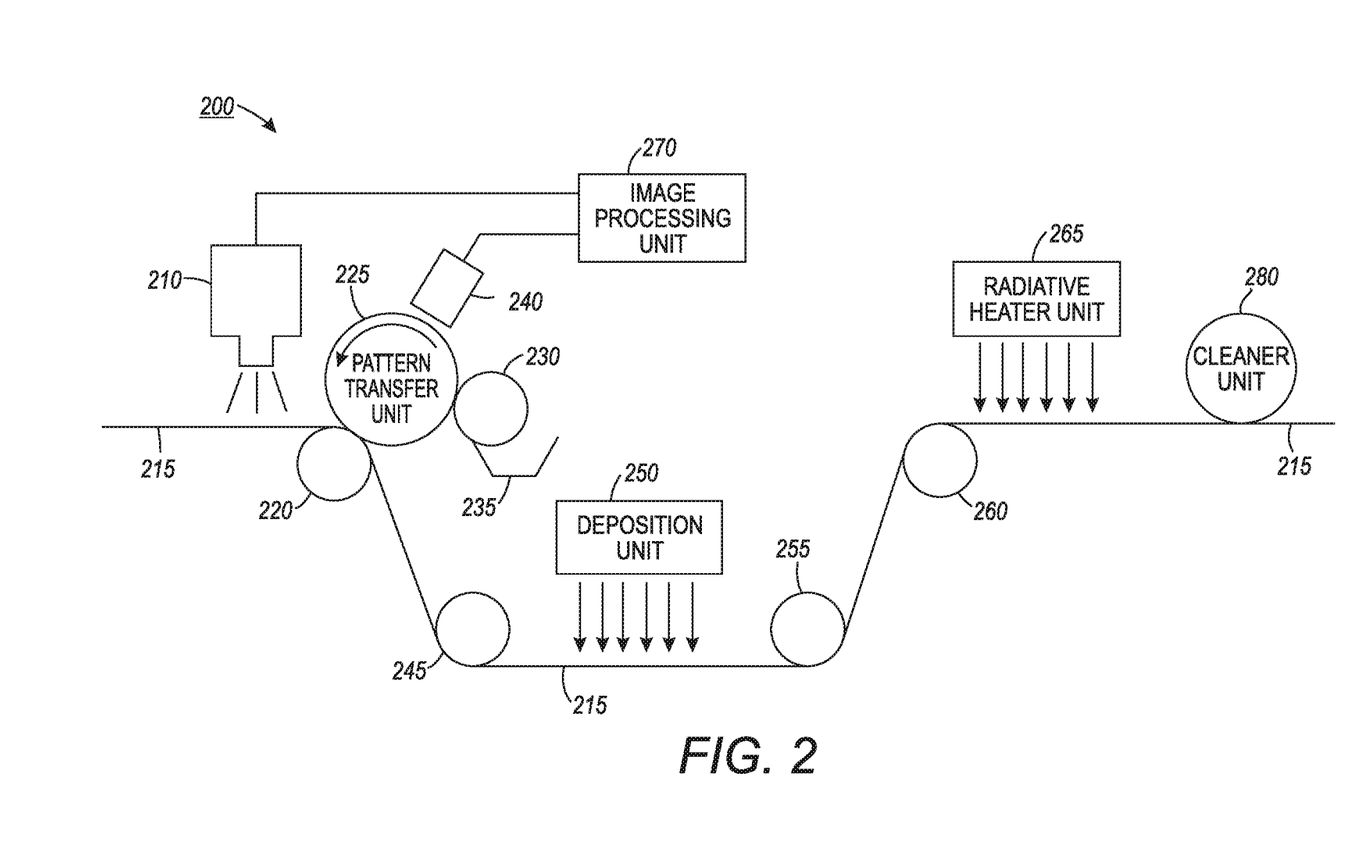
FIG. 2 illustrates a schematic representation of a first exemplary embodiment of a deposition system including a variable data digital lithographic image forming device according to this disclosure.

FIG. 2 illustrates a schematic representation of a first exemplary embodiment of a deposition system 200 including a variable data digital lithographic image forming device according to this disclosure. As shown in FIG. 2, a variable data digital lithographic image forming device may be adapted to pattern a control/release agent (silicone oil) layer on a reimageable surface of a pattern transfer drum 225. Note that certain of the components associated with the variable data digital lithographic image forming device shown in FIG. 1 are omitted in FIG. 2 for clarity. Understanding that a separate inker subsystem may have no place in this embodiment, it will remain beneficial to have a cleaning unit for cleaning residual patterned control/release agent from the reimageable surface, as appropriate.

In the embodiment depicted in FIG. 2, a layer of control/release agent may be uniformly deposited on the pattern transfer drum 225 from a control/release agent reservoir 235 via a control/release agent application device 230. Although depicted in FIG. 2 as a roller-type control/release agent application device 230, the disclosed embodiments are not intended to be limited to such a construct. The uniform layer of control/release agent may then be patterned by exposure to an image patterning unit 240 that may irradiate the layer to selectively evaporate portions of the layer. The thus digitally patterned layer of control/release agent may then be transferred to substrate 215, including a printed electronics substrate, at a transfer nip between the pattern transfer drum 225 and a pressure roller 220. The substrate 215 may be threaded past or around a series of guide rollers 245,255, 260.

It should be recognized that the variable data digital lithographic image architecture used for inked image forming does not provide for a high quality transfer of the dampening solution (oil) layer to the substrate itself because printing substrates such as paper are commonly very porous and may wick the fountain solution pattern laterally. However, for printing electronics applications and other applications addressed by this disclosure, most substrates are non-porous and non-absorbing and may consist, for example, of high quality polymer or metal thin sheet materials that maintain high temperature processing integrity. Such materials may include thin polymide or PET, as examples. Therefore, this subtle deviation from the variable data digital lithographic image forming architecture is of no problem for printing electronics applications.

Those of skill in the art will recognize that, while this approach is still slightly more involved than inkjet additive manufacturing, it allows for high resolution deposition of high quality materials with bulk conductivity properties that inkjet could not effectively deposit, while avoiding granularity and coffee staining issues of an inkjet process.

The pattern transfer unit 225 may be highly IR absorbing and slightly conformal, but need not have the low surface energy appropriate to versions of the proposed variable data digital lithographic image forming architecture for ink transfer because high transfer efficiency of a dampening solution is not necessary. However, the texture of the pattern transfer unit 225 surface must be sufficiently specified to hold a correct amount of control/release agent to produce an appropriate thickness of the uniform layer. A controlled microtexture is desirable such that a controlled amount of the control/release agent is patterned by the image patterning unit 240. Therefore, any black elastomeric material such as NBR (nitride) or EPDM can be used in addition to silicone or fluorosilicone materials as long as the surface texture is optimized.

One or more imaging cameras 210, which may include a stroboscopic camera, may be positioned upstream in a process direction and focused on a substrate surface upstream from the pattern transfer unit 225. Images captured by the one or more imaging cameras 210 before the transfer step may be fed to an image processing unit 270 to adjust the relative positioning of the patterning by the image patterning unit 240 in relation to the substrate 215 so as to align the projected pattern to at least one of alignment marks or pre-patterned underlayers on the substrate 215. An advantage of the disclosed scheme is that, during the transfer step, such adjustments can be made on-the-fly while the substrate 215 is in full motion, taking into account, for example, a time delay based upon an instantaneous substrate process velocity.

The as-patterned substrate 215 may then continue its movement downstream in a process direction past a deposition unit 250 in which any one of the deposition materials described above may be deposited on the patterned surface of the substrate 215. Once the deposition layer of material is deposited on the as-patterned substrate 215, the processed substrate 215 may continue to be moved in a process direction around a series of rollers 255,260, one or more of which may be heated, and ultimately past a heater unit that may be a radiative heater unit 265 in order to remove the deposited control/release agent layer and overlying deposited material through evaporation of the control/release agent layer leaving only the patterned layer of deposited material on the substrate 215. A cleaner unit 280 may be provided for cleaning residue from the deposited pattern on the substrate 215.

Figure 3:
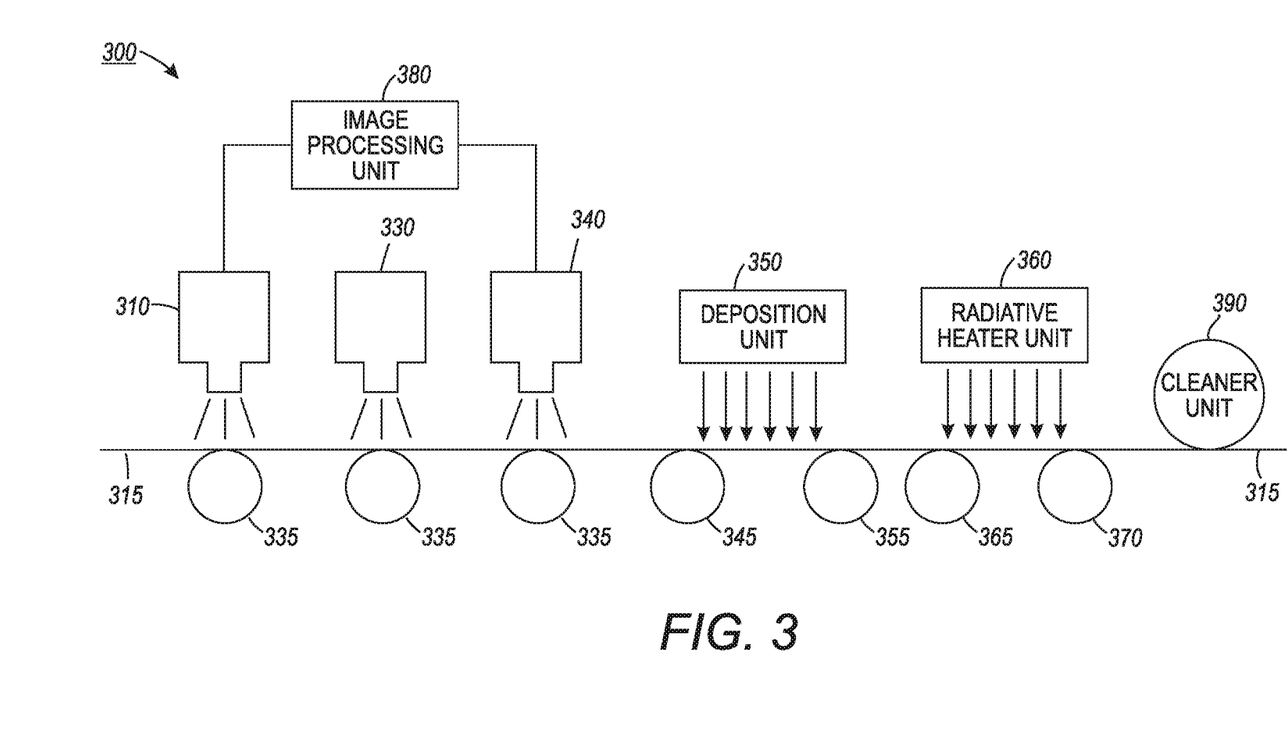
FIG. 3 illustrates a schematic representation of a second exemplary embodiment of a deposition system including a variable data digital lithographic image forming technique according to this disclosure.

FIG. 3 illustrates a schematic representation of a second exemplary embodiment of a deposition system 300 including a variable data digital lithographic image forming technique according to this disclosure. Not all applications may involve a roll-to-roll substrate as some desirable substrates, such as, for example, FR-4 based circuit boards, may not be uniform in thickness or flatness and may also have complex geometries. For such substrates, it may be more difficult to transfer a patterned control/release agent layer with good alignment. Thus, other sheet-fed like system architectures may be more desirable for such substrates. A common application may be for example, electroplating precursor onto a PCB board that aligns to a pre-patterned underneath layer. For such an application, it may be more optimal to pattern the control/release agent layer not by pattern transfer from a pattern transfer unit such as that shown in FIG. 2, but to directly pattern the control/release agent layer on the final substrate to ensure pattern alignment given variations in topography, preferably in a non-contact process.

As shown in FIG. 3, a variable data digital lithographic image forming process may be adapted to pattern a control/release agent (silicone oil) layer directly on a surface of a substrate 315. The layer of control/release agent may be uniformly deposited on the substrate 315 using a control/release agent application device 330. Although depicted in FIG. 3 as a spray or jet-type control/release agent application device 330, the disclosed embodiments are not intended to be limited to such a construct. The uniform layer of control/release agent may then be patterned by exposure to an image patterning unit 340 that may irradiate the layer to selectively evaporate portions of the layer. The substrate 315 may be translated in a process direction across a series of guide rollers 320,325,335,345,355,365,370, one or more of which may be heated to facilitate the processing of the substrate in the process direction across the series of guide rollers.

One or more imaging cameras 310, which may include a stroboscopic camera, may be positioned upstream in a process direction from control/release agent application device 330 and the image patterning unit 340 and focused on a substrate surface. Images captured by the one or more imaging cameras 310 before the transfer step may be fed to an image processing unit 380 to adjust the relative positioning of the patterning by the image patterning unit 340 in relation to the substrate 315 so as to align the projected pattern to at least one of alignment marks or pre-patterned underlayers on the substrate 315. An advantage of the disclosed scheme is that, during the transfer step, such adjustments can be made on-the-fly while the substrate 315 is in full motion by adjusting a time delay based upon a instantaneous substrate 315 process velocity.

The as-patterned substrate 315 may then continue its movement downstream in a process direction past a deposition unit 350 in which any one of the deposition materials described above may be deposited on the patterned surface of the substrate 315. Once the deposition layer of material is deposited on the as-patterned substrate 315, the processed substrate 315 may continue to be moved in a process direction ultimately past a heater unit that may be a radiative heater unit 360 in order to remove the deposited control/release agent layer and overlying deposited material through evaporation of the control/release agent layer leaving only the patterned layer of deposited material on the substrate 315. Such a solution also allows for the control/release agent to initially be deposited using vapor or spray deposition such that no physical contact steps are included in the process. After the metal is deposited, it nucleates in a pattern-wise fashion, and may easily be removed using heat, leaving behind a clean substrate. A cleaner unit 390 may be provided for cleaning residue from the deposited pattern on the substrate 315.

In general, it may be advantageous to have the imaging step and the transfer step take place inside vacuum chamber as this positioning may bring the patterning step closer to the development step and allow for a lower amount of laser energy necessary to pattern-wise evaporate a higher molecular weight control/release agent (oil rejection) layer.

After pattern-wise cross linking or isomeric transformation is chemically induced, a first temperature development step may be performed to selectively develop the pattern by selectively evaporating off the undeveloped portion. A second temperature step may be performed to remove the entire oil based film after patterned metal deposition takes place.

The variable data optical patterning architecture may employ one of a standard laser, a UV laser, a high power UV LED light source or other heating element as the image patterning element.

Other variations in the disclosed schemes may include using a silicone oil with black NIR toner particles dispersed in the deposited layer. This embodiment would require no existing changes to the variable data digital lithographic image forming optical subsystem. In terms of the NIR filler approach, silicone oil LID (liquid ink development) based toners have been made in the past with black submicron toner. These silicone oil based LID materials have largely been abandoned in many applications in favor of other less costly mineral or isopar based liquid carriers. In the disclosed scheme, however, the silicone oil LID based toners may be used and still make economic sense, as they are far cheaper than photoresists used, and because the disclosed scheme does not require precision electrostatic control, only blanket deposition. To effectively stop the nucleation of an evaporated metal layer, the carbon black toner may preferentially reside at the substrate interface, and not the air interface, allowing the low surface energy oil to be present as a thin film at the air interface. In addition, the laser should have enough explosive energy to eject toner particles along with the silicone oil with kinetic energy away from the surface. Doing this in a vacuum environment is likely to help for an exhaust removal without re-deposition of toner. Such layers after NIR laser patterning followed by the metal evaporation step could be removed by a combination of electrostatics (to pull out toner) and heat. An advantage of this approach is that a low cost NIR diode bar laser system already developed for the proposed variable data digital lithographic image forming process may be completely reused.

The proposed schemes may improve on current manufacturing processes by opening up a possibility for rapid manufacturing of many different applications in printed electronics including touch screen displays, OLEDs, PCBs, and thin film printed electronics. The disclosed schemes provide a variable data digital process to control selective deposition in, for example, vapor deposition processes such as the evaporation or sputtering of metals, dielectrics, semiconductors and the like. These schemes leverage the laser process developed for the proposed variable data digital lithographic image forming system architecture. The dampening materials proposed for that architecture may also be adapted. The very thin layers that may be employed in the disclosed schemes translate into low exposure energy, which may occur in a partial vacuum.

Figure 4:
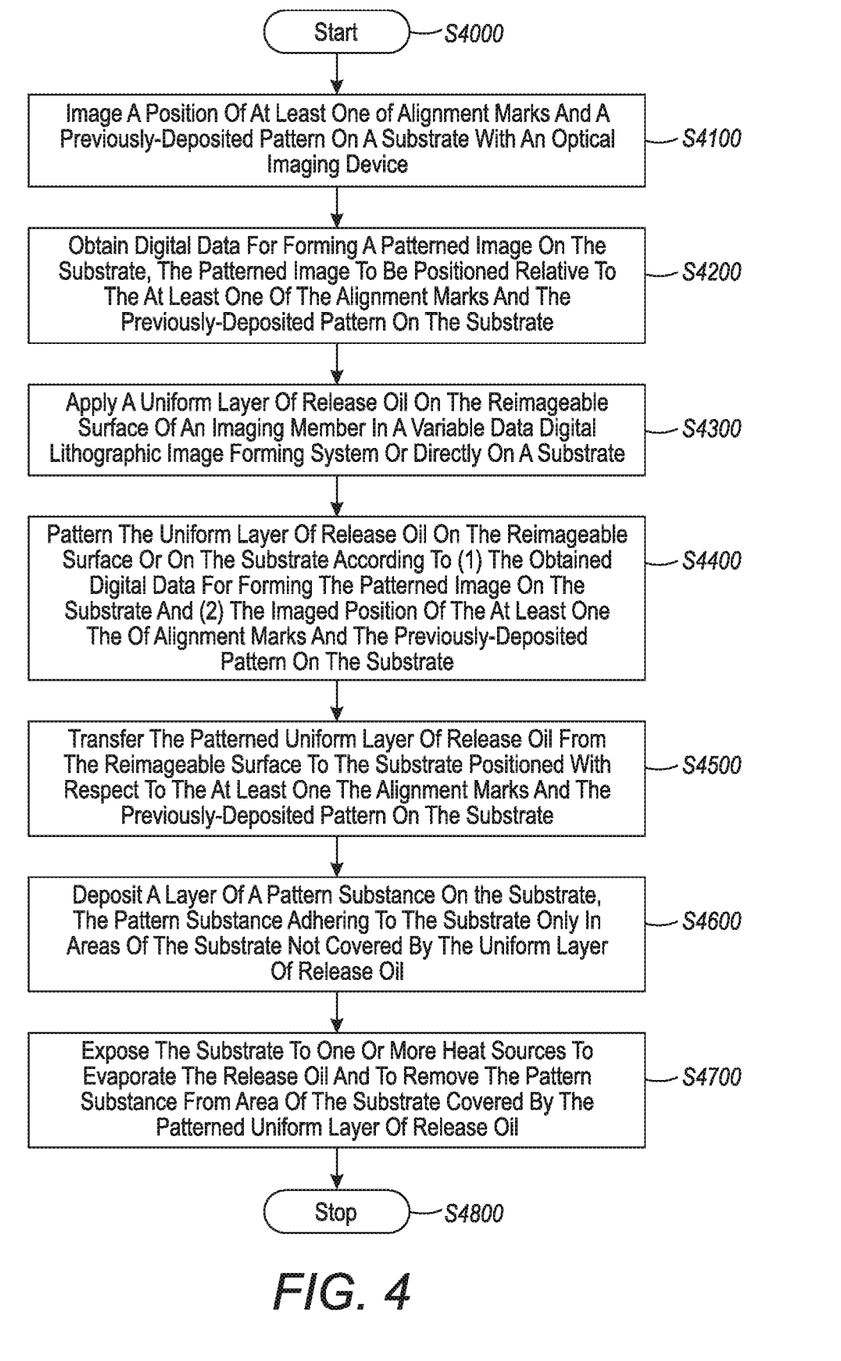
FIG. 4 illustrates a flowchart of an exemplary method for implementing a variable data deposition process with a proposed variable data digital lithographic image forming device/technique according to this disclosure.

The disclosed embodiments may include an exemplary method for implementing a variable data deposition process with a proposed variable data digital lithographic image forming device/technique. FIG. 4 illustrates a flowchart of such an exemplary method. As shown in FIG. 4, operation of the method commences at Step S4000 and proceeds to Step S4100.

In Step S4100, a position of at least one of alignment marks and a previously-deposited pattern on the substrate may be imaged with an optical imaging device. Operation of the method proceeds to Step S4200.

In Step S4200, digital data for forming a patterned image on the substrate may be obtained. The patterned image is intended to be position relative to the at least one of the alignment marks in the previously-deposited pattern on the substrate. Operation of the method proceeds to Step S4300.

In Step S4300, a uniform layer of release oil may be applied to at least one of a reimageable surface of an imaging member in a variable data digital lithographic image forming system, or directly onto a substrate. Operation of the method proceeds to Step S4400.

In Step S4400, the uniform layer of release oil on the reimageable surface or on the substrate may be patterned according (1) to the obtained digital data for forming the patterned image on the substrate and (2) the imaged position of the at least one of the alignment marks and the previously-deposited pattern on the substrate. Operation of the method proceeds to Step S4500.

In Step S4500, in instances where the patterned uniform layer of release oil is not deposited directly onto the substrate, the patterned uniform layer of release oil may be transferred from the reimageable surface to the substrate positioned substantially precisely with respect to at least one of the alignment marks and the previously-deposited pattern on the substrate. Operation the method proceeds to Step S4600.

In Step S4600, a layer of a pattern substance may be deposited on the substrate. The pattern substance being any one of the materials described in some detail above and adhering to the substrate only in areas of the substrate not covered by the patterned uniform layer of release oil. Operation of the method proceeds to Step S4700.

In Step S4700, the substrate may be exposed to one or more heat sources to evaporate the release oil from the surface of the substrate thereby removing the pattern substance from areas of the substrate covered by the patterned uniform layer of release oil leaving only the layer of pattern substance adhering to the substrate as a production layer in the manufacturing process. Operation the method proceeds to Step S4800, where operation of the method ceases.

The above-described exemplary systems and methods may reference certain conventional image forming device components to provide a brief, background description of image forming means that may be adapted to carry into effect the variable data digital control/release agent layer deposition processes in support of the disclosed schemes. No particular limitation to a specific configuration of the variable data digital lithography portions or modules of an overall deposition system is to be construed based on the description of the exemplary elements depicted and described above.

Those skilled in the art will appreciate that other embodiments of the disclosed subject matter may be practiced with many types of image forming elements common to lithographic image forming systems in many different configurations. As mentioned briefly above, the disclosed systems are described in exemplary embodiments generally along two paths: patterned image formation on the pattern transfer element and patterned image formation directly on a substrate. It should be understood that these are non-limiting examples of the variations that may be undertaken according to the disclosed schemes. In other words, no particular limiting configuration is to be implied from the above description and the accompanying drawings.

The exemplary depicted sequence of executable method steps represents one example of a corresponding sequence of acts for implementing the functions described in the steps. The exemplary depicted steps may be executed in any reasonable order to carry into effect the objectives of the disclosed embodiments. No particular order to the disclosed steps of the method is necessarily implied by the depiction in FIG. 4, and the accompanying description, except where any particular method step is reasonably considered to be a necessary precondition to execution of any other method step. Individual method steps may be carried out in sequence or in parallel in simultaneous or near simultaneous timing. Additionally, not all of the depicted and described method steps need to be included in any particular scheme according to disclosure.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

We claim:

1. A material deposition method for selectively depositing a pattern substance on a substrate that is one of a roll-to-roll substrate and a sheet-fed substrate fed into a material deposition system to form a printed substrate, comprising:
   applying a layer of release agent on a release agent receiving member with a release agent applying device vertically above the substrate and, the release agent receiving member being one of the substrate and an intermediate surface, the substrate being one of the roll-to-roll substrate and the sheet-fed substrate fed into the material deposition system for single pass processing through the material deposition system;
   digitally patterning the layer of release agent applied on the release agent receiving member with a patterning device vertically above a portion of the substrate being acted on by the patterning device and spatially apart from the release agent receiving member based on a variable data digital imaging input from a processor;
   depositing the pattern substance on a surface of the substrate and the patterned layer of release agent via vapor deposition to form the printed substrate, the pattern substance adhering to portions of the printed substrate not covered by the release agent;
   removing residual pattern substance and the release agent from the surface of the printed substrate with a cleaner vertically above a portion of the substrate being acted on by the cleaner along the path of the substrate; and
   outputting manufactured components comprising the deposited pattern substance on the surface of the substrate.

2. The material deposition method of claim 1, the intermediate surface being a reimageable surface on an imaging member, the method further comprising transferring the patterned layer of the release agent to the substrate at a transfer nip between the reimageable surface and the substrate.

3. The material deposition method of claim 1, further comprising imaging at least one of alignment marks on the substrate or an underlying pattern already disposed on the substrate with an imaging device positioned upstream of the patterning device in a process direction, the imaging device sending a signal to the processor for modifying the directed patterning of the layer of release agent based on the imaged at least one of alignment marks on the substrate or the underlying pattern already disposed on the substrate.

4. The material deposition method of claim 1, the patterning of the layer of release agent on the one of the substrate or the intermediate surface being based on inputs from the processor that change between each directed patterning of the release agent.

5. The material deposition method of claim 1, further comprising heating the substrate after the pattern substance is deposited on the surface of the substrate to evaporate the patterned layer of release agent on the surface of the substrate to remove residual release agent and non-patterned residual pattern substance from the surface of the substrate.

6. The material deposition method of claim 1, the patterning comprising employing a laser device for selectively patterning the layer of release agent on the one of the substrate or the intermediate surface.

7. A material deposition method for selectively depositing a pattern substance on a printed electronics substrate that is a roll-to-roll substrate fed into a material deposition system to form a printed substrate, comprising:
   applying a layer of release agent on a release agent receiving member with a release agent applying device, the release agent receiving member being one of the printed electronics substrate and an intermediate surface, the printed electronics substrate being the roll-to-roll substrate fed into the material deposition system for single pass processing through the material deposition system;
   digitally patterning the layer of release agent applied on the release agent receiving member with a patterning device spatially apart from the release agent receiving member based on a variable data digital imaging input from a processor;
   depositing the pattern substance on a surface of the printed electronics substrate and the patterned layer of release agent via selective deposition to form the printed substrate, the pattern substance adhering to portions of the printed electronics substrate not covered by the release agent;
   removing residual pattern substance and the release agent from the surface of the printed electronics substrate; and
   outputting manufactured components comprising the deposited pattern substance on the surface of the printed electronics substrate.

8. The material deposition method of claim 7, wherein the release agent receiving member is the printed electronics substrate, and the patterning of the layer of release agent on the printed electronics substrate is based on inputs from the processor that change between each directed patterning of the release agent.

9. The material deposition method of claim 7, the intermediate surface being a reimageable surface on an imaging member, the method further comprising transferring the patterned layer of the release agent to the printed electronics substrate at a transfer nip between the reimageable surface and the printed electronics substrate.

10. The material deposition method of claim 7, further comprising imaging at least one of alignment marks on the printed electronics substrate or an underlying pattern already disposed on the printed electronics substrate with an imaging device positioned upstream of the patterning device in a process direction, the imaging device sending a signal to the processor for modifying the directed patterning of the layer of release agent based on the imaged at least one of alignment marks on the substrate or the underlying pattern already disposed on the printed electronics substrate.

11. The material deposition method of claim 7, wherein the release agent receiving member is the intermediate surface, and the patterning of the layer of release agent on the intermediate surface is based on inputs from the processor that change between each directed patterning of the release agent.

12. The material deposition method of claim 7, further comprising heating the printed electronics substrate after the pattern substance is deposited on the surface of the printed electronics substrate to evaporate the patterned layer of release agent on the surface of the printed electronics substrate to remove residual release agent and non-patterned residual pattern substance from the surface of the printed electronics substrate.

13. The material deposition method of claim 7, the patterning comprising employing a laser device for selectively patterning the layer of release agent on the one of the printed electronics substrate or the intermediate surface.

14. A material deposition method for selectively depositing a pattern substance on a printed electronics substrate that is a sheet-fed substrate fed into a material deposition system to form a printed substrate, comprising:
　applying a layer of release agent on a release agent receiving member with a release agent applying device, the release agent receiving member being one of the printed electronics substrate and an intermediate surface, the printed electronics substrate being the sheet-fed substrate fed into the material deposition system for single pass processing through the material deposition system;
　digitally patterning the layer of release agent applied on the release agent receiving member with a patterning device spatially apart from the release agent receiving member based on a variable data digital imaging input from a processor;
　depositing the pattern substance on a surface of the printed electronics substrate and the patterned layer of release agent via selective deposition to form the printed substrate, the pattern substance adhering to portions of the printed electronics substrate not covered by the release agent;
　removing residual pattern substance and the release agent from the surface of the printed electronics substrate; and
　outputting manufactured components comprising the deposited pattern substance on the surface of the printed electronics substrate.

15. The material deposition method of claim 14, wherein the release agent receiving member is the printed electronics substrate, and the patterning of the layer of release agent on the printed electronics substrate is based on inputs from the processor that change between each directed patterning of the release agent.

16. The material deposition method of claim 14, the intermediate surface being a reimageable surface on an imaging member, the method further comprising transferring the patterned layer of the release agent to the printed electronics substrate at a transfer nip between the reimageable surface and the printed electronics substrate.

17. The material deposition method of claim 14, further comprising imaging at least one of alignment marks on the printed electronics substrate or an underlying pattern already disposed on the printed electronics substrate with an imaging device positioned upstream of the patterning device in a process direction, the imaging device sending a signal to the processor for modifying the directed patterning of the layer of release agent based on the imaged at least one of alignment marks on the substrate or the underlying pattern already disposed on the printed electronics substrate.

18. The material deposition method of claim 14, wherein the release agent receiving member is the intermediate surface, and the patterning of the layer of release agent on the intermediate surface is based on inputs from the processor that change between each directed patterning of the release agent.

19. The material deposition method of claim 14, further comprising heating the printed electronics substrate after the pattern substance is deposited on the surface of the printed electronics substrate to evaporate the patterned layer of release agent on the surface of the printed electronics substrate to remove residual release agent and non-patterned residual pattern substance from the surface of the printed electronics substrate.

20. The material deposition method of claim 14, the patterning comprising employing a laser device for selectively patterning the layer of release agent on the one of the printed electronics substrate or the intermediate surface.

\* \* \* \* \*